United States Patent [19]

Nulman et al.

[11] Patent Number: 5,242,860

[45] Date of Patent: Sep. 7, 1993

[54] METHOD FOR THE FORMATION OF TIN BARRIER LAYER WITH PREFERENTIAL (111) CRYSTALLOGRAPHIC ORIENTATION

[75] Inventors: Jaim Nulman, Palo Alto; Kenny K. Ngan, Fremont, both of Calif.

[73] Assignee: Applied Materials, Inc., Santa Clara, Calif.

[21] Appl. No.: 735,397

[22] Filed: Jul. 24, 1991

[51] Int. Cl.⁵ .................. H01L 21/441; H01L 21/477
[52] U.S. Cl. .................... 437/190; 437/192; 437/200; 437/247
[58] Field of Search ................. 437/190, 192, 200, 247

[56] References Cited

U.S. PATENT DOCUMENTS

| | | | |
|---|---|---|---|
| 4,379,832 | 4/1983 | Dalal et al. | 430/315 |
| 4,545,115 | 10/1985 | Bauer et al. | 29/590 |
| 4,585,517 | 4/1986 | Stemple | 156/643 |
| 4,629,635 | 12/1986 | Brors | 427/255.2 |
| 4,657,628 | 4/1987 | Holloway et al. | 156/643 |
| 4,676,866 | 6/1987 | Tang et al. | 156/643 |
| 4,687,542 | 8/1987 | Davis et al. | 156/643 |
| 4,785,962 | 11/1988 | Toshima | 220/260 |
| 4,836,905 | 6/1989 | Davis et al. | 204/298 |
| 4,847,111 | 7/1989 | Chow et al. | 427/38 |
| 4,855,798 | 8/1989 | Imamura et al. | 357/71 |
| 5,049,975 | 9/1991 | Ajika et al. | 357/23.5 X |

FOREIGN PATENT DOCUMENTS

0157052 12/1984 European Pat. Off. .

OTHER PUBLICATIONS

Adams, E. D., et al., "Formation of TiSi₂ and TiN during Nitrogen Annealing of Magnetron Sputtered Ti Films", *Journal of Vacuum Science Technology*, vol. A 3(6), Nov./Dec., 1985, pp. 2264-2267.

Alperin, Michael E., et al., "Development of the Self-Aligned Titanium Silicide Process for VLSI Applications", *IEEE Transactions on Electron Devices*, vol. ED-32, No. 2, Feb. 1985, pp. 141-149.

Bomchil, G., et al., "Influence of Oxygen on the Formation of Refractory Metal Silicides", *Thin Solid Films*, vol. 140, 1986, pp. 59-70.

Morgan, A. E., et al., "Formation of Titanium Nitride/Silicide Bilayers by Rapid Thermal Anneal in Nitrogen", *Rapid Thermal Processing*, Pittsburgh, Pa.: Publ. Mater. Res. Soc., 1986, pp. 279-287.

Okamoto, Tatsuo, et al., "Titanium Silicidation by Halogen Lamp Annealing", *J. Appl. Phys.*, vol. 57, No. 12, Jun. 15, 1985, pp. 5251-5255.

Shatas, Steven C., "Heatpulse Rapid Thermal Processing for Annealing Refractory Metal Silicides", Workshop on Refractory Metal Silicides for VLSI, San Juan Bautista, Calif., Sep. 20-22, 1983.

Tang, Thomas E., et al., "Titanium Nitride Local Interconnect Technology for VLSI", *IEEE Transactions on Electron Devices*, vol. ED-34, No. 3, Mar. 1987, pp. 682-688.

Ting, C. Y., "TiN Formed by Evaporation as a Diffusion Barrier Between Al and Si", *J. Vac. Sci. Technol.*, vol. 21, No. 1, May/Jun. 1982, pp. 14-18.

Tsukamoto, K., et al., "Self-Aligned Titanium Silicidation of Submicron MOS Devices by Rapid Lamp Annealing", *IEDM 84*, 1984, pp. 130-133.

*Primary Examiner*—John S. Maples
*Attorney, Agent, or Firm*—John P. Taylor

[57] ABSTRACT

A process is described for forming, over a silicon surface, a titanium nitride barrier layer having a surface of (111) crystallographic orientation. The process comprises: depositing a first titanium layer over a silicon surface; sputtering a titanium nitride layer over the titanium layer; depositing a second titanium layer over the sputtered titanium nitride layer; and then annealing the structure in the presence of a nitrogen-bearing gas, and in the absence of an oxygen-bearing gas, to form the desired titanium nitride having a surface of (111) crystallographic orientation and a sufficient thickness to provide protection of the underlying silicon against spiking of the aluminum. When an aluminum layer is subsequently formed over the (111) oriented titanium nitride surface, the aluminum will then assume the same (111) crystallographic orientation, resulting in an aluminum layer having enhanced resistance to electromigration.

17 Claims, 2 Drawing Sheets

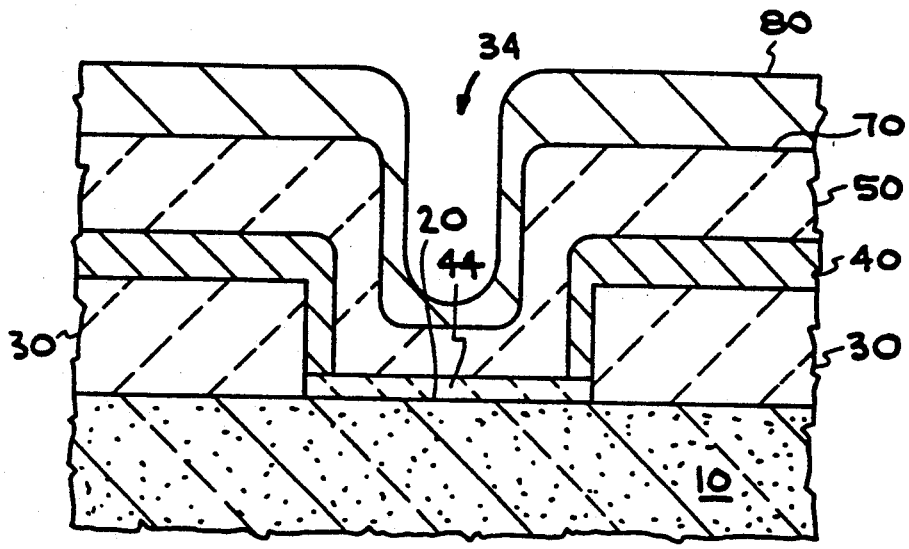

FIG. 5

DEPOSITING A FIRST TITANIUM LAYER OVER A SILICON SURFACE OF AN INTEGRATED CIRCUIT STRUCTURE

DEPOSITING A LAYER OF TITANIUM NITRIDE OVER THE FIRST TITANIUM LAYER ON THE STRUCTURE

DEPOSITING A SECOND LAYER OF TITANIUM OVER THE TITANIUM NITRIDE LAYER ON THE STRUCTURE

ANNEALING THE STRUCTURE IN A NITROGEN-BEARING ATMOSPHERE AND IN THE ABSENCE OF OXYGEN TO FORM TITANIUM NITRIDE OF (III) CRYSTALLOGRAPHIC ORIENTATION ON THE SURFACE AND TO FORM TITANIUM SILICIDE OVER THE SILICON SURFACE OF THE INTEGRATED CIRCUIT STRUCTURE

FIG. 6

METHOD FOR THE FORMATION OF TIN BARRIER LAYER WITH PREFERENTIAL (111) CRYSTALLOGRAPHIC ORIENTATION

BACKGROUND OF THE INVENTION

1. Field of the Invention

This invention relates to a method for forming a titanium nitride (TiN) barrier layer having a (111) crystallographic orientation on an integrated circuit structure.

2. Description of the Related Art

In the formation of integrated circuit structures, aluminum is used for forming the electrical connections or wiring between active and/or passive devices comprising the integrated circuit structure. Conventionally this involves the use of aluminum which is electrically connected to underlying silicon in the structure. While the aluminum and silicon are electrically connected together, it has become the practice to use intermediate electrically conductive layers interposed between the silicon and aluminum to respectively provide better electrical connection to the silicon, and to provide a physical (metallurgical) barrier between the silicon and aluminum to prevent spiking of the aluminum into the silicon, i.e., migration of aluminum atoms into the underlying silicon, which can interfere with the performance and reliability of the resulting integrated circuit structure.

Conventionally, one method which has been used to accomplish this has been to deposit a layer of titanium over a silicon surface, e.g., to form a with the silicon, and then to anneal the titanium-coated structure in the presence of nitrogen whereby a titanium silicide layer forms over the exposed silicon to form a good electrical contact with the silicon and titanium nitride forms over the titanium silicide as the surface of the titanium layer reacts with the nitrogen atmosphere.

While this method does accomplish the formation of a good electrical contact to the silicon, by formation of the titanium silicide, it often does not result in a satisfactory formation of a barrier layer of titanium nitride over the titanium silicide. This is because the simultaneous formation of both the titanium silicide and the titanium nitride from the same titanium layer results in competing reactions wherein more of the titanium reacts with the silicon, resulting in the formation of a layer of titanium nitride of insufficient thickness to provide the desired barrier protection against aluminum spiking.

One prior art solution to this problem has been to form the titanium silicide barrier layer first and then to sputter additional titanium nitride over the titanium silicide or titanium silicide/titanium nitride layer. In this way a sufficient thickness of titanium nitride may be formed to provide the desired barrier layer.

While the above method results in satisfactory formation of a titanium silicide contact layer and a titanium nitride barrier layer over the silicide, and beneath the subsequently deposited aluminum, an problem has been encountered involving electromigration of aluminum atoms in the aluminum layer, during subsequent operation of the integrated circuit structure, if the aluminum layer is not formed with a (111) crystallographic orientation. Such electromigration of the aluminum atoms can result in open circuits in the integrated circuit structure and, therefore, such electromigration must be inhibited or eliminated.

Formation of titanium nitride by the nitration of titanium will result in formation of a titanium nitride layer having a (111) crystallographic orientation. However, as discussed above, formation of such a titanium nitride from titanium deposited over silicon does not result in formation of a sufficiently thick titanium nitride barrier layer.

Conversely, while sputter deposition of titanium nitride will form the desired thickness of titanium nitride barrier layer, the crystallographic orientation of sputtered titanium nitride is usually either (200) or polycrystalline.

It would, therefore, be desirable to form a titanium nitride barrier layer over a silicon surface with a titanium nitride surface having a (111) crystallographic orientation, whereby spiking of aluminum through such a titanium nitride layer would be inhibited or eliminated, yet the formation of aluminum of (111) crystallographic orientation would be promoted by the nucleation sites provided by the (111) crystallographic orientation of the underlying titanium nitride surface.

SUMMARY OF THE INVENTION

The invention, therefore, comprises a process for forming, over a silicon surface, a titanium nitride barrier layer having a surface of (111) crystallographic orientation which comprises: depositing a first titanium layer over a silicon surface; sputtering a titanium nitride layer over the titanium layer; depositing a second titanium layer over the sputtered titanium nitride layer; and annealing the structure in the presence of a nitrogen-bearing gas, and in the absence of an oxygen-bearing gas, to form the desired titanium nitride having a surface of (111) crystallographic orientation and a sufficient thickness to provide protection of the underlying silicon against spiking of the aluminum.

During the anneal, the first titanium layer reacts with the underlying silicon to form the desired titanium silicide electrical contact, while the second titanium layer reacts with the nitrogen in the nitrogen-bearing atmosphere to form titanium nitride of (111) crystallographic orientation.

The sputtered intermediate titanium nitride layer functions both to form the desired barrier layer as well as to separate the two titanium layers during the annealing step so that the respective titanium silicide and (111) titanium nitride structures may be formed independently by respective reactions of the respective titanium layers with the underlying silicon and the nitrogen-bearing atmosphere.

An aluminum layer subsequently formed over the (111) oriented titanium nitride surface will then assume the same (111) crystallographic orientation, resulting in an aluminum layer having enhanced resistance to electromigration.

BRIEF DESCRIPTION OF THE DRAWINGS

FIG. 5 shows the structure of FIG. 4 with an aluminum layer of (111) crystallographic orientation shown formed over the oriented titanium nitride surface.

FIG. 6 is a flowsheet illustrating the process of the invention.

DETAILED DESCRIPTION OF THE INVENTION

The invention comprises a method for forming a titanium nitride barrier layer over a silicon surface which is capable of preventing spiking from a subsequently deposited aluminum layer over the titanium nitride barrier layer, and which will have a surface of (111) crystallographic orientation whereby the titanium nitride layer may also function as a nucleation layer for the subsequent formation of an aluminum layer thereon having a (111) crystallographic orientation.

Figure 1:
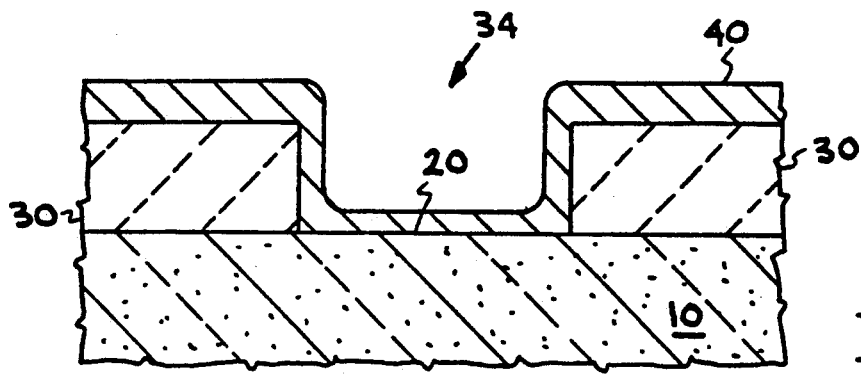
FIG. 1 is a vertical fragmentary cross-sectional view of the first step of the process showing the deposition of a first layer of titanium over a silicon surface.

Referring now to FIG. 1, an integrated circuit structure comprising silicon material is shown at 10 having a silicon surface 20 thereon. Illustrated silicon integrated circuit structure 10 may comprise, for example, a silicon wafer having an active device formed therein wherein silicon surface 20 may comprise the upper surface of a source or drain region of an MOS device formed in the silicon wafer or the upper surface of a collector or base region of a bipolar transistor formed in the silicon wafer. Alternatively, silicon structure 10 (and silicon surface 20 thereon) may, for example, comprise a polysilicon contact formed over other layers of the circuit structure to provide electrical contact to an active device; or silicon structure 10 may comprise some other type of polysilicon interconnecting structure.

In the illustrated embodiment, an oxide layer 30 is shown formed over silicon surface 20 with an opening 34 formed therein to permit formation of an electrical contact or via to an aluminum layer or structure which will subsequently be formed over oxide layer 30. It will be understood, however, that the presence or absence of such an oxide layer has nothing to do with the practice of this invention.

As shown in FIG. 1, an initial layer 40 of titanium is formed over the entire structure by any conventional deposition technique such as CVD or PVD (sputter deposition) to a thickness which may range from about 50 to about 1000 Angstroms, preferably from about 100 to about 500 Angstroms, and typically about 200 Angstroms.

Figure 2:
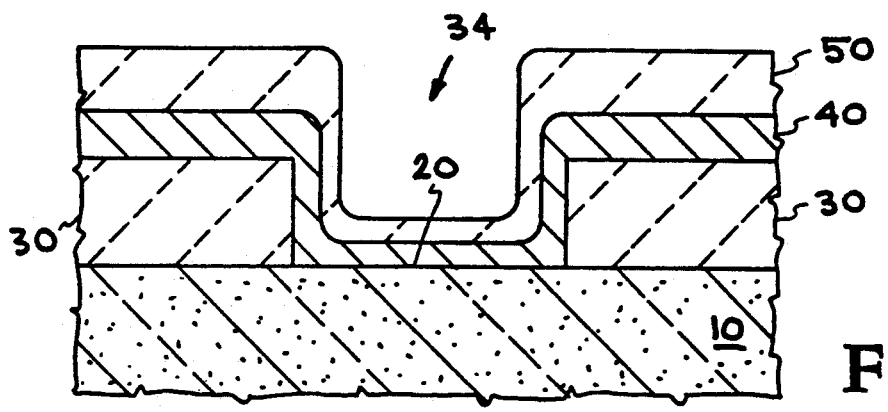
FIG. 2 is a vertical fragmentary cross-sectional view of the second step of the process showing a layer of titanium nitride sputter deposited over the first layer of titanium.

After formation of titanium layer 40, a layer 50 of titanium nitride is sputtered over titanium layer 40 to form the structure shown in FIG. 2. Sputtered titanium nitride layer 50 must be formed thick enough to function as the barrier layer between silicon surface 20 and a subsequently applied aluminum layer to prevent spiking of the aluminum into silicon structure 10. Sputtered titanium nitride layer 50 is, therefore, formed with a thickness ranging from about 500 to about 1500 Angstroms, preferably from about 700 to about 1000 Angstroms, and typically to a thickness of about 800 Angstroms.

Titanium nitride layer 50 may be formed in the same chamber used for deposition of titanium layer 40 or in a sputter chamber in the same or a different apparatus. It must be noted, however, that since titanium layer 40 has not, as yet been annealed, resulting in reaction between titanium layer 40 and silicon surface 20 to form the desired titanium silicide contact thereon, it is important that titanium layer 40 not come into contact with an oxygen-bearing atmosphere. Thus, if it is necessary to move silicon structure 10 from one chamber or apparatus to another, after deposition of titanium layer 40 thereon, it is important that any such movement of structure 10 be carried out under oxygen-free conditions.

Figure 3:
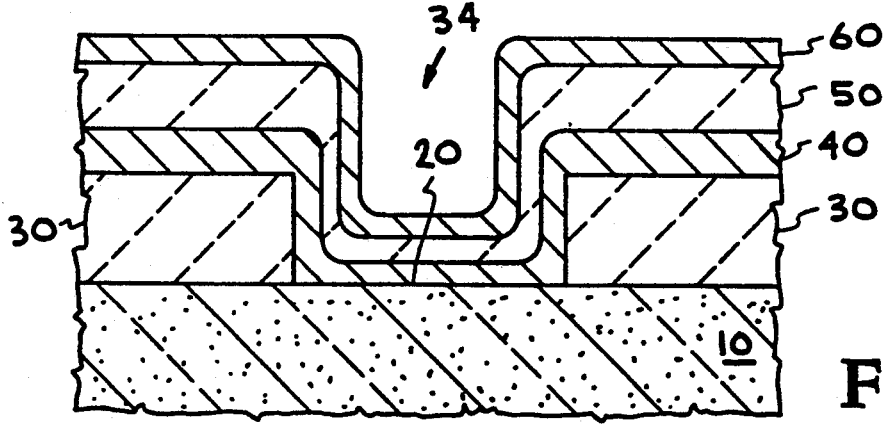
FIG. 3 is a vertical fragmentary cross-sectional view of the third step of the process showing the deposition of a second layer of titanium over the sputter deposited titanium nitride layer.

After formation of titanium nitride barrier layer 50, a second titanium layer 60 is deposited over titanium nitride layer 50 as shown in FIG. 3. Second titanium layer 60 is deposited to a thickness ranging from about 100 to about 500 Angstroms, preferably from about 300 to about 400 Angstroms. Second titanium layer 60 may be deposited over titanium nitride layer 50 in the same manner as previously discussed for the formation of first titanium layer 40.

Preferably, titanium nitride layer 50 is treated in the same manner as titanium layer 40 with respect to exposure to oxygen-bearing gases. That is, titanium nitride layer 50 is preferably not exposed to oxygen-bearing gases after its deposition over first titanium layer 40 and prior to the deposition of second titanium layer 60 over titanium nitride layer 50.

Figure 4:
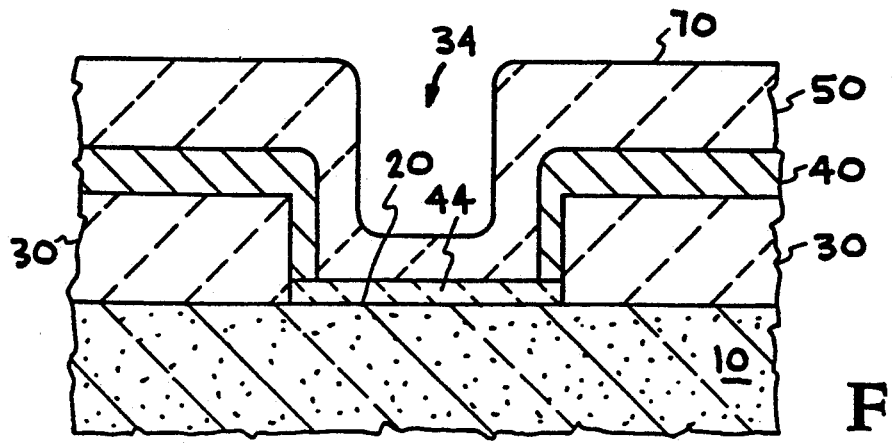
FIG. 4 is a vertical fragmentary cross-sectional view of the fourth step of the process showing the formation of a titanium silicide layer over the silicon surface by reaction of the silicon with the first layer of titanium during an annealing step, and the simultaneous formation of a titanium nitride layer of (111) crystallographic orientation over the sputter deposited titanium nitride layer by reaction of the second layer of titanium with a nitrogen-bearing gas in the absence of any oxygen-bearing gases during the annealing step.

After deposition of second titanium layer 60, the structure is annealed in a nitrogen-bearing atmosphere to react first titanium 40 with the underlying silicon to form a titanium silicide contact 44 between silicon surface 20 and titanium nitride layer 50; and to react second titanium layer 60 with nitrogen to form a titanium nitride surface 70 having a crystallographic orientation, as shown in the structure of FIG. 4.

It should be noted that, as previously discussed with respect to first titanium layer 40, appropriate measures must be taken to protect titanium layer 60 from exposure to any oxygen-bearing gases prior to the annealing step to avoid formation of titanium oxides.

The structure then may be annealed at an initial annealing temperature preferably ranging from about 300° C. to about 900° C., preferably from about 500° C. to about 800° C., and typically about 700° C. Preferably, the annealing is carried out under rapid anneal conditions where the wafer is ramped up to the annealing temperature at a rate of from about 5° C. per second to about 150° C. per second, preferably from about 30° C./second to about 80° C./second, and the anneal is carried out for a period of time ranging from about 5 to about 180 seconds, preferably from about 20 to about 60 seconds.

In accordance with the invention the structure is annealed in a nitrogen-bearing atmosphere, e.g. a gaseous mixture containing nitrogen and an inert gas such as argon or helium, and in the absence of oxygen or any oxygen-bearing gases which would react with titanium layer 60 to form titanium oxide which would otherwise interfere with the desired reaction between titanium layer 60 and the nitrogen in the annealing atmosphere to form the desired titanium nitride layer with (111) crystallographic orientation. Such a nitrogen-bearing atmosphere may be achieved in the annealing chamber by flowing one or more nitrogen-bearing gases into an annealing chamber at a rate of from about 500 to about 10,000 sccm (depending on the vacuum pump capacity) while maintaining the pressure in the annealing chamber within a range of from about 100 milliTorr to about 800 Torr. The anneal may also be carried out in two steps wherein the annealing temperature in the first step does not exceed about 695° C., following which the structure is subjected to a second annealing at a temperature of from about 800° C. to about 900° C. for from about 5 to about 180 seconds, preferably from about 20 to about 60 seconds, to convert the less stable C49 phase titanium silicide formed in the first annealing step to a more stable C54 phase, as is well know to those skilled in the art. Such two stage annealing is described in copending application Serial No. 07/510,307, filed Apr. 16, 1990, and assigned to the assignee of this invention.

It should be noted that the reaction of titanium layer 60 with the nitrogen in the annealing atmosphere to form the (111) crystallographic oriented titanium nitride results in the formation of titanium nitride having the desired crystallographic orientation at surface 70 and adjacent thereto, but not necessarily extending through the entire bulk of previously sputtered underlying titanium nitride layer 50.

However, since only surface 70 of the titanium nitride and a region extending a few Angstroms beneath surface 70, will be capable of acting as nucleation sites for subsequently deposited aluminum to cause the formation of (111) crystallographically oriented aluminum, it is not necessary that all of the underlying titanium nitride, which is principally present to act as a barrier layer, have such crystallographic orientation.

In view of this, the structure depicted in FIG. 4 is shown with a single titanium nitride layer identified by the numeral 50, while the surface of layer 50 is identified by numeral 70, it being understood that the (111) crystallographic orientation of the titanium nitride at surface 70 will extend down into titanium nitride layer 50 a distance which may be about equal to the original thickness of titanium layer 60, with such titanium nitride of crystallographic orientation gradually merging into the underlying titanium nitride without a sharp line of demarcation therebetween.

After formation of the (111) crystallographically oriented titanium nitride surface 70, an aluminum layer 80, having the desired (111) crystallographic orientation may be conventionally formed over surface 70 by a CVD or PVD process, such as, for example, by sputtering from about 0.1 to about 1.5 microns of aluminum over the entire structure, as shown in FIG. 5. The resulting aluminum layer may then be conventionally patterned to form the desired final aluminum wiring harness or structure.

Thus, the invention provides a process for the formation of titanium nitride on an integrated circuit structure wherein a silicon surface and a layer of aluminum may be electrically connected together while being separated by titanium nitride which functions as a barrier layer of sufficient thickness to inhibit spiking of aluminum through the titanium nitride to the underlying silicon, and has a (111) crystallographic surface on the titanium nitride which will promote subsequent formation of aluminum thereon having such (111) crystallographic orientation.

Having thus described the invention what is claimed is:

1. A process for forming, over a silicon surface, a titanium nitride barrier layer having a surface of (111) crystallographic orientation which comprises:
   a) depositing from about 50 to about 1000 Angstroms of a first titanium layer over a silicon surface;
   b) depositing from about 700 to about 1000 Angstroms of a titanium nitride layer over said first titanium layer;
   c) depositing from about 300 to about 400 Angstroms of a second titanium layer over said titanium nitride layer; and
   d) annealing the structure in the presence of a nitrogen-bearing gas, and in the absence of an oxygen-bearing gas to form titanium nitride having a surface of (111) crystallographic orientation from said second titanium layer;
   e) whereby said resulting titanium nitride barrier layer, comprising said deposited titanium nitride intermediate layer and sad titanium nitride formed by annealing said second titanium layer in an atmosphere of nitrogen, has a surface of (111) crystallographic orientation and a sufficient thickness to provide protection of the underlying silicon against spiking by aluminum subsequently formed over said titanium nitride barrier layer.

2. The process of claim 1 wherein said step of depositing a layer of titanium nitride over said first layer of titanium further comprises sputtering said layer of titanium nitride over said first layer of titanium.

3. The process of claim 2 which further includes the formation of titanium silicide by reaction of said first titanium layer with said underlying silicon surface to form a titanium silicide electrical contact between said silicon surface and said titanium nitride.

4. The process of claim 3 including the further step of forming an aluminum layer over said (111) oriented titanium nitride surface, whereby said aluminum layer will assume the (111) crystallographic orientation of said titanium nitride surface thereunder, resulting in an aluminum layer having enhanced resistance to electromigration.

5. The process of claim 1 wherein said step of annealing said structure further comprises annealing said structure at a temperature ranging from about 300° C. to about 900° C.

6. The process of claim 1 wherein said step of annealing said structure further comprises annealing said structure in an annealing chamber maintained at a pressure within a range of from about 100 milliTorr to about 800 Torr.

7. The process of claim 1 wherein said annealing step is carried out in an annealing chamber while flowing one or more nitrogen-bearing gases into said chamber at a rate of from about 500 to about 10,000 sccm.

8. The process of claim 7 wherein said step of annealing said structure further comprises annealing said structure under rapid anneal conditions where the structure is ramped up to an annealing temperature ranging from about 300° C. to about 900° C. at a rate of from about 5° C. per second to about 150° C. per second, and then maintaining said structure at said temperature for a period ranging from about 5 to about 180 seconds.

9. The process of claim 7 wherein said step of annealing said structure further comprises annealing said structure under rapid anneal conditions where the structure is ramped up to an annealing temperature ranging from about 500° C. to about 800° C. at a rate of from about 30° C. per second to about 80° C. per second, and then maintaining said structure at said temperature for a period ranging from about 20 to about 60 seconds.

10. The process of claim 7 wherein said annealing step comprises:
   a) first annealing said structure under rapid anneal conditions where the structure is ramped up to a first annealing temperature ranging from about 300° C. to about 695° C. at a rate of from about 5° C. per second to about 150° C. per second, and maintaining said structure at said first annealing temperature for a period ranging from about 5 to about 180 seconds; and
   b) then raising said annealing temperature up to from about 800° C. to about 900° C. after said initial anneal for an additional time period of from about 5 to about 180 seconds to convert the less stable titanium silicide formed in the first annealing step to a more stable phase.

11. The process of claim 1 wherein said annealing step is carried out after said deposition of said second layer of titanium without exposing said second layer of titanium to an oxygen-bearing gas between said deposition and annealing steps.

12. The process of claim 2 wherein said step of sputtering said titanium nitride layer over said first layer of titanium is carried out without exposing said first layer of titanium to an oxygen-bearing gas before said layer of titanium nitride is sputtered thereon.

13. The process of claim 1 wherein said step of depositing said second layer of titanium over said layer of titanium nitride is carried out without exposing said layer of titanium nitride to an oxygen-bearing gas before said second layer of titanium is deposited thereon.

14. A process for forming, over a silicon surface, a titanium nitride barrier layer having a surface of (111) crystallographic orientation which comprises:
   a) depositing from about 50 to about 1000 Angstroms of a first titanium layer over a silicon surface;
   b) sputtering from about 700 to about 1000 Angstroms of an intermediate titanium nitride layer over said first titanium layer;
   c) depositing from about 300 to about 400 Angstroms of a second titanium layer over said intermediate titanium nitride layer; and
   d) annealing the structure in the presence of a nitrogen-bearing gas, and in the absence of an oxygen-bearing gas to form titanium silicide from said first titanium layer over said silicon surface and to form titanium nitride having a surface of (111) crystallographic orientation from said second titanium layer;
   whereby said resulting titanium nitride barrier layer, comprising said sputtered titanium nitride intermediate layer and said titanium nitride formed by annealing said second titanium layer in an atmosphere of nitrogen, has a surface of (111) crystallographic orientation and a sufficient thickness to provide protection of the underlying silicon against spiking by aluminum subsequently formed over said titanium nitride barrier layer.

15. The process of claim 14 wherein said step of annealing said structure further comprises annealing said structure in an annealing chamber maintained at a pressure of from about 100 milliTorr to about 800 Torr under rapid anneal conditions where the structure is ramped up to an annealing temperature ranging from about 300° C. to about 900° C. at a rate of from about 5° C. per second to about 150° C. per second, and then maintaining said structure at said temperature for a period ranging from about 5 to about 180 seconds.

16. The process of claim 14 including the further step of forming an aluminum layer over said (111) oriented titanium nitride surface, whereby said aluminum layer will assume the (111) crystallographic orientation of said titanium nitride surface thereunder, resulting in an aluminum layer having enhanced resistance to electromigration.

17. A process for forming, over a silicon surface, a titanium nitride barrier layer having a surface of (111) crystallographic orientation which comprises:
   a) depositing from about 50 to about 1000 Angstroms of a first titanium layer over a silicon surface;
   b) sputtering from about 700 to about 1000 Angstroms of an intermediate titanium nitride layer over said first titanium layer;
   c) depositing from about 300 to about 400 Angstroms of a second titanium layer over said intermediate titanium nitride layer;
   d) annealing the structure in the presence of a nitrogen-bearing gas, and in the absence of an oxygen-bearing gas in an annealing chamber maintained at a pressure of from about 100 milliTorr to about 800 Torr to form titanium silicide from said first titanium layer over said silicon surface and to form titanium nitride having a surface of (111) crystallographic orientation from said second titanium layer by:
      i) heating said structure up to an annealing temperature ranging from said about 600° C. to about 695° C. at a rate of from about 5° C. per second to about 150° C. per second;
      ii) maintaining said structure at said temperature for a period ranging from about 50 to about 180 seconds;
      iii) raising said annealing temperature up to from about 800° C. to about 900° C. after said initial anneal; and
      iv) maintaining said structure at said temperature for an additional time period of from about 5 to about 180 seconds to convert the less stable titanium silicide formed in said first annealing step to a more stable phase;
   whereby said resulting titanium nitride barrier layer, comprising said intermediate sputtered titanium nitride layer and said titanium nitride formed by annealing said second titanium layer in an atmosphere of nitrogen, has a surface of (111) crystallographic orientation and a sufficient thickness to provide protection of the underlying silicon against spiking by aluminum subsequently formed over said titanium nitride barrier layer; and
   e) forming an aluminum layer over said (111) oriented titanium nitride surface, whereby said aluminum layer will assume the (111) crystallographic orientation of said titanium nitride surface thereunder, resulting in an aluminum layer having enhanced resistance to electromigration.

* * * * *